United States Patent
Feiweier

(10) Patent No.: US 8,854,037 B2
(45) Date of Patent: Oct. 7, 2014

(54) METHOD FOR COMPENSATING FOR EDDY CURRENT FIELDS IN MAGNETIC RESONANCE IMAGES

(75) Inventor: Thorsten Feiweier, Poxdorf (DE)

(73) Assignee: Siemens Aktiengesellschaft, München (DE)

( * ) Notice: Subject to any disclaimer, the term of this patent is extended or adjusted under 35 U.S.C. 154(b) by 468 days.

(21) Appl. No.: 13/218,435

(22) Filed: Aug. 25, 2011

(65) Prior Publication Data

US 2012/0217966 A1 Aug. 30, 2012

(30) Foreign Application Priority Data

Aug. 26, 2010 (DE) .......................... 10 2010 035 539

(51) Int. Cl.
*G01V 3/00* (2006.01)
*G01R 33/565* (2006.01)

(52) U.S. Cl.
CPC .............................. *G01R 33/56518* (2013.01)
USPC ....................................................... 324/307

(58) Field of Classification Search
USPC .................................................. 324/300–322
See application file for complete search history.

(56) References Cited

U.S. PATENT DOCUMENTS

| | | | | |
|---|---|---|---|---|
| 4,585,995 | A * | 4/1986 | Flugan | 324/322 |
| 4,910,460 | A * | 3/1990 | Sebok | 324/307 |
| 5,451,877 | A | 9/1995 | Weissenberger | |
| 5,864,233 | A | 1/1999 | Zhou et al. | |
| 6,538,443 | B2 * | 3/2003 | Morich et al. | 324/318 |
| 6,696,836 | B2 * | 2/2004 | Kimmlingen | 324/309 |
| 6,867,590 | B2 * | 3/2005 | Carlini | 324/309 |
| 6,903,552 | B2 * | 6/2005 | Dietz et al. | 324/318 |
| 6,957,097 | B2 * | 10/2005 | Park et al. | 600/419 |
| 7,002,343 | B2 | 2/2006 | Weissenberger | |
| 7,046,004 | B2 * | 5/2006 | Bieri et al. | 324/307 |
| 7,888,935 | B1 * | 2/2011 | Tan et al. | 324/309 |
| 8,487,614 | B2 * | 7/2013 | Kamata | 324/307 |
| 2005/0258829 | A1 * | 11/2005 | Bieri et al. | 324/307 |

FOREIGN PATENT DOCUMENTS

| | | |
|---|---|---|
| DE | 199 54 925 A1 | 5/2001 |
| DE | 10 2008 028 773 A1 | 12/2009 |
| DE | 10 2010 001 577 A1 | 9/2011 |
| DE | 10 2010 013 605 A1 | 10/2011 |

OTHER PUBLICATIONS

German Office Action dated Jun. 30, 2011 for corresponding German Patent Application No. DE 10 2010 035 539.9 with English translation.

(Continued)

*Primary Examiner* — Dixomara Vargas
(74) *Attorney, Agent, or Firm* — Lempia Summerfield Katz LLC

(57) ABSTRACT

A method for compensating for eddy current fields in magnetic resonance images acquired using a magnetic resonance apparatus is provided. A global component of the eddy current fields corresponding to a zeroth order and a first order is compensated globally using a change in control parameters of at least one device of the magnetic resonance apparatus that is suitable for compensating for the global components (e.g., a reference oscillator and/or a gradient coil). In order to correct local higher-order eddy current fields in a volume of interest characterized by a prominent point, the residual eddy current fields remaining following compensation of the global component are developed around the point. Correction values for the control parameters are determined from the zeroth- and/or first-order local components of the development and are taken into account in the control of the magnetic resonance apparatus for magnetic resonance image acquisition.

20 Claims, 2 Drawing Sheets

(56) References Cited

OTHER PUBLICATIONS

M. A. Morich et al., "Exact Temporal Eddy Current Compensation in Magnetic Resonance Imaging Systems," IEEE Transactions on Medical Imaging, vol. 7, No. 3 (1988): pp. 247-254.

I. C. Atkinson et al., "Characterization and Correction of System Delays and Eddy Currents for MR Imaging with Ultrashort Echo-Time and Time-Varying Gradients," Magnetic Resonance in Medicine 62 (2009): pp. 532-537.

C. Barmet et al., "A third-order field camera with microsecond resolution for MR system diagnostics," Proceedings of the International Society for Magnetic Resonance in Medicine 17 (2009): p. 781.

P. Sipilä et al., "Continuous magnetic field mapping with pulsed 1H NMR probes," Proceedings of the International Society for Magnetic Resonance in Medicine 17 (2009): p. 782.

\* cited by examiner

METHOD FOR COMPENSATING FOR EDDY CURRENT FIELDS IN MAGNETIC RESONANCE IMAGES

This application claims the benefit of DE 10 2010 035 539.9, filed on Aug. 26, 2010.

BACKGROUND

The present embodiments relate to a method for compensating for eddy current fields in magnetic resonance images acquired using a magnetic resonance apparatus.

Artifacts induced by eddy currents represent a problem in a number of magnetic resonance techniques, including imaging and spectroscopic methods. An example of this is diffusion imaging (e.g., diffusion-weighted echo planar imaging (EPI)), in which high gradient amplitudes (e.g., diffusion gradients) are combined with a great sensitivity to dynamic field interferences (e.g., approximately 10 Hz per pixel in the phase-encoding direction). Distortions having an appearance that is dependent both on the amplitude of the gradients (e.g., diffusion weighting) and on the direction of the gradients are observed. In the case of spectroscopic magnetic resonance techniques, eddy-current-induced artifacts, which may be caused by strong localization gradients, cause, for example, undesirable changes in line shape or width. Turbo spin echo (TSE) imaging is also cited in this connection, since in acquisitions of joint images, for example, a volume of interest that is located at a distance from the isocenter may be used, such that eddy current fields that may result in artifacts in the images may be present.

It is known to provide a magnetic resonance apparatus with actively shielded gradient coils that significantly reduce the penetration of the gradient fields into conductive structures (e.g., a cryostat of a magnet). Also known are pre-distortion ("pre-emphasis") methods, using which remaining zeroth- and first-order eddy current components may be suppressed further by modifying the control of a reference oscillator and/or of the gradient coil. Examples of pre-emphasis methods are disclosed in U.S. Pat. No. 7,002,343 B2 and U.S. Pat. No. 5,451,877, for example. For these methods, it is known to measure the time-dynamic response of the eddy current fields for specific parameters, for example, during tune-up (e.g., installation of the magnetic resonance apparatus) and/or during maintenance. The eddy current fields may be described as a linear system, such that the eddy current fields may be determined from the pre-measurement how the reference oscillator and the gradient coil are to be driven so that the actual time responses correspond to the target time responses in an optimized approximation. In practice, the pre-distortions may be added to the target time response using mathematical methods, and the modified time response is used as an amended control parameter for control purposes.

While these measures are adequate for many imaging methods in order to achieve a diagnostic image quality, in the case of very sensitive magnetic resonance techniques (e.g., the diffusion-weighted EPI imaging or localized spectroscopy), serious artifacts continue to occur in the data in spite of these measures.

Further improvements are proposed, a basic distinction being made between "active" and "passive" measures. Within the scope of the present embodiments, the descriptor "active" may refer to a measure, in which there is an intervention into the physical image acquisition process, where with "passive" measures, a post-processing of the acquired magnetic resonance data (e.g., image processing) is performed.

One known active method that may be employed in addition to a pre-emphasis method is described, for example, in U.S. Pat. No. 5,864,233. Prior knowledge of the zeroth- and first-order eddy current field global components remaining (e.g., for a specific image acquisition protocol) is used for active global compensation. In order to compensate for the zeroth-order global component, a dynamic change in the phase and/or frequency of a reference oscillator provided, for example, at the receiving device may be compensated for, while first-order global components are to be eliminated using an offset in the control of the gradients. An active compensation of low-order global effects is described.

Passive measures have also been described, for example, in German patent applications DE 10 2010 013 605.0 and DE 10 2010 001 577.6. The disadvantage of these methods is due to the purely passive character: information that has already been lost during the acquisition process may not be reconstructed.

With regard to the active methods (e.g., by aligning the imaging gradients for the first order and adjusting the frequency and/or phase of the reference oscillator for the zeroth order), in the case of a magnetic resonance apparatus with actively shielded gradient coils and implemented pre-emphasis methods, the higher-order effects constitute the dominant component among the occurring artifacts (e.g., compare in this regard German patent application DE 10 2010 001 577.6). The active correction known, for example, from U.S. Pat. No. 5,864,233 is not able to compensate for the higher-order effects, while the cited passive methods have the disadvantage that information may be lost during the image acquisition process.

SUMMARY AND DESCRIPTION

The present embodiments may obviate one or more of the drawbacks or limitations in the related art. For example, a method, may at least partially, actively compensate for higher-order effects.

In one embodiment, a method of the type cited in the introduction that develops residual eddy current fields remaining around a prominent point following compensation of a global component in order to correct higher-order local eddy current fields in a volume of interest characterized by the prominent point, is provided. Correction values for the control parameters are determined from zeroth- and/or first-order local components of the development and taken into account in the control of the magnetic resonance apparatus for the purposes of magnetic resonance image acquisition.

One embodiment of the method proceeds on the basis of an already existing correction of global components of the eddy current fields. Control parameters that are the result of a desired pulse sequence are modified in order to effect the global compensation of the lower-order global components. In order to determine the modified control parameters for global compensation purposes, a pre-emphasis method and/or an offset method, in which offsets of a frequency and/or a phase of the reference oscillator and/or a modified control of the gradient coil are determined and switched. In a single magnetic resonance apparatus, a pre-distortion (pre-emphasis) method may be used at a high temporal resolution that corrects the global components generated by the actually used gradient pulses by superimposing corresponding time-variable control signals, and/or modifies the control of a reference oscillator. Additionally, an offset method as described in U.S. Pat. No. 5,864,233 cited in the introduction may be used, since both methods result in modified control parameters (e.g., for the reference oscillator and/or the gradient coil). In addition to these already modified control parameters, one embodiment of the method also calculates correction values that enable higher-order residual eddy current fields to be compensated for at least locally.

An improved compensation of the occurring eddy current fields may be performed actively and in a localized manner in order to improve the quality of the acquired magnetic resonance images. The approach according to the present embodiments is based on the fact that the spatial geometry of the residual eddy current fields is continuous and varies slowly, dominant second- or third-order components frequently being found. This becomes clear, for example, with the development according to spherical harmonics described in DE 10 2010 001 577.6 (e.g., effectively according to polynomials).

The present embodiments exploit the fact that the volume of interest (VOI) in an examination may be limited, for example, to one layer, a multilayer stack, or an image voxel. The volume of interest is shifted in space with respect to the isocenter of the magnetic field of the magnetic resonance apparatus, toward which the active compensation of the global components is performed. According to the present embodiments, the control parameters for the volume of interest, which may vary within the course of a measurement (e.g., in the case of a multilayer measurement) may be optimized (e.g., the control of the imaging gradients and/or of the reference oscillator, starting from the known active compensation of the global components such that the zeroth- and first-order components of the residual eddy current fields are minimized locally). A partial compensation of higher-order residual fields effectively takes place. An active localized correction focused on the volume of interest, which may be characterized by the prominent point, may be performed without the need to expand the magnetic resonance apparatus with additional hardware in that corresponding compensation gradients or corrections to the frequency and/or phase of the reference oscillator are determined such that at the prominent point, locally strongly reduced eddy current fields and consequently reduced artifacts may be realized.

Within the scope of the method according to the present embodiments, consideration is given to the residual eddy current fields still remaining following the compensation of the global component. The residual eddy current fields are developed around the prominent point of the volume of interest so that zeroth- and/or first-order local components may be determined. From the active global compensation, it is known how zeroth- and/or first-order components of the eddy current fields may be compensated for so that correction values that are used in addition to the active global compensation may accordingly be determined. For example, a further shift or temporal variation in the frequency and/or phase of the reference oscillator may be provided, or additional gradient offsets and/or time-variable compensation gradients may be used. The correction values are taken into account in conjunction with the change as part of the global active compensation in the control of the magnetic resonance apparatus for the purpose of magnetic resonance image acquisition, with the result that locally in the relevant region (e.g., the volume of interest), eddy current fields and consequently eddy-current-induced artifacts (e.g., image distortions or signal variations) may significantly be reduced during the image acquisition process.

An advantage of the method according to the present embodiments compared with the prior art is therefore that an active compensation may be provided, such that information is preserved during the image acquisition process. This is combined with a localization for partial compensation of higher-order eddy current fields without the need for additional hardware components, since only the compensation-related control of the reference oscillator and of the imaging gradients may be adjusted.

The residual eddy current fields are determined on the basis of a measurement and/or computationally. While the residual eddy current fields may be determined solely based on a calculation (e.g., a simulation), more reliable data is determined taking into account measured data of a measurement, from which the residual eddy current fields may be determined directly or computationally.

For example, for measurement purposes, the residual eddy current fields are determined taking into account at least one preliminary measurement on an object to be imaged. Using image acquisition, parameters also used later for image acquisition to acquire at least one image prior to the measurement (e.g., in the course of a preliminary measurement). The residual eddy current fields present during the actual measurement may be determined directly or indirectly from the at least one image. Taking the example of diffusion imaging, it is known from DE 10 2010 013 605.0, for example, how, for a specific image acquisition protocol, the residual eddy current fields are measured in a spatially resolved manner such that the result obtained for each pixel is a distortion vector, from which the residual eddy current field amplitude may be calculated directly. Four preliminary measurements, for example, are performed (e.g., one measurement without any diffusion gradients and three preliminary measurements, in which one of the gradients is set to a specific value in each case). From the four preliminary measurements, the distortion that, in addition to the spatial dependence, is also dependent on the strength of the diffusion gradient so that on the basis of the actual measurements, the residual eddy current fields may be determined for different diffusion gradients, is determined.

In one embodiment, in order to measure the residual eddy current fields, the residual eddy current fields are determined on the basis of at least one measurement using a field camera. This is useful, for example, in the case of spectroscopic measurements, in which deductions about the spatial geometry of the eddy current fields may not be made from the measurement. Instead, the measurement of the residual eddy current fields including higher orders may be performed, for example, using a field camera (e.g., as expounded in the publications in the Proceedings of the International Society for Magnetic Resonance in Medicine (ISMRM), Honolulu, Hi., 2009, on page 780 ("A third-order field camera with microsecond resolution for MR system diagnostics") or page 781 ("Continuous magnet field mapping with pulsed 1H NMR probes")). With the field cameras, probes are introduced for a preliminary measurement into the volume to be measured and are calibrated, since the object to be imaged (e.g., a patient) has a negligible effect on the residual eddy current fields. In one embodiment, it is advantageous if, given adequate temporal resolution of the field cameras, the eddy current fields are determined as a function of time. This subject is discussed in greater detail below.

The residual eddy current fields are calculated taking into account at least one measurement performed during the tune-up of the magnetic resonance apparatus. In such a fundamental calibration measurement, which may be performed, for example, when the magnetic resonance apparatus is set up, information, from which, given knowledge of the measurement protocol or pulse sequence to be used, deductions may be made about the actual case, is present. For such a tune-up measurement, a magnetic resonance experiment with a defined phantom setup basically known from the prior art may be used. The approach is employed, for example, in the case of the pre-emphasis methods. At least some of the higher orders (e.g., the residual eddy current fields) and the pre-emphasis parameters that subsequently determine the modification of the control parameters for the global compensation may be measured. The modification may advantageously be determined in a time-resolved manner.

In one embodiment of the method, the volume of interest may be determined by a user and/or automatically (e.g., using an overview image ("localizer")). A number of possibilities for marking or automatically determining the volume of interest are known in the prior art. A localizer, in which, for example, regions of interest may be defined using segmentation methods, may be used. Some of the segmentation methods may also be performed manually. The localizer may be displayed to a user who marks the volume of interest using suitable tools of a user interface. If the magnetic resonance apparatus possesses a mode for automatically aligning the layer position (e.g., "Auto-Align"), the information known from this may also be used for automatically determining the volume of interest. Other methods to determine the volume of interest may be used.

The prominent point may be determined as the focal point of the volume of interest. A geometric center point of the volume of interest may be determined, as it is possible, in the case of a weighting, for example, to incorporate further information as well. The focal point of the volume of interest forms the center of the compensation as the prominent point.

In one embodiment, a weighting may be applied by determining the prominent point using a weighting function (e.g., a self-weighting). Once the volume of interest is known, a weighting value describing the relevance of the point may be assigned to the individual pixels. While a weighting may be applied, for example, by a user and/or automatically, to specific, possibly segmented regions in the volume of interest, a self-weighting may be easy to implement and yields beneficial results. In the course of the self-weighting, each pixel of a magnetic resonance image (e.g., of a localizer) is weighted with a measured intensity. Only parts of the volume to be imaged, in which imaging tissue is also present, may be considered relevant in the case of a self-weighting. This, for example, enables the user, for example, not to take the limits of the object that is to be imaged into account when defining the volume of interest.

In one embodiment, if there is a change in the volume of interest, the correction terms for a new volume of interest are re-determined. The volume of interest may change during a measurement (e.g., in multilayer image acquisitions or if a motion process is to be recorded). The change in the volume of interest may be responded to dynamically. The development for the current volume of interest may always be performed and the correction terms may be determined. A good local compensation is given throughout the course of the entire measurement.

In one embodiment, if field coils configured for compensating for eddy current field components of higher order than first order (e.g., second order), the local components corresponding to the order of the field coils of the residual eddy current fields remaining after compensation using the field coils are determined in the development and used for correcting the control of the field coils for compensating for the local components. The method according to the present embodiments may be expanded accordingly if correction possibilities for higher-order components exist. Thus, for example, at least one field that is configured for globally compensating for second-order global components of the eddy current fields, such that the third- or higher-order components still remain in the volume of interest, may be provided. The components are developed into the prominent point up to the second order, and the control parameters of the field coil are also adjusted such that the residual eddy current fields are compensated for locally up to the second order. Such rapidly switchable higher-order field coils are described, for example, in DE 10 2008 028 773 A1. The method according to the present embodiments may therefore be expanded arbitrarily if compensation possibilities for higher orders of the eddy current fields are present in any case.

The method according to the present embodiments is suitable for magnetic resonance image acquisition using a diffusion imaging method and/or a spectroscopy method, since in both cases, strong gradients that exhibit relevant higher-order effects occur, possibly leading to artifacts and able to be locally and actively compensated for using the method according to the present embodiments.

In one embodiment, a time dependence of the eddy current fields may be taken into account. In some cases, a largely static examination of the eddy current fields may be carried out. The largely static examination is always useful when the method for determining the spatial distribution of the eddy current fields (e.g., the described determination method from magnetic resonance images) and the image acquisition, in which the correction according to the present embodiments is applied, exhibit the same or a very similar sensitivity to the temporal variation of the eddy current fields. If the time characteristic of the residual eddy current fields is determined in addition to a spatial distribution, which is possible, for example, when a field camera is used and/or when a measurement is performed during installation and/or maintenance of the magnetic resonance apparatus, correction values taking the time characteristic into account may also be determined, for example, in the course of a pre-emphasis method. The correction values referred to the time characteristic may manifest as additional exponential timing elements.

If the time dependence of the residual eddy current fields is also taken into consideration, a broader field of application results than if the temporal dependence is ignored. Imaging methods having a nonisocentric prominent point may benefit from the advantages according to the present embodiments. If a measurement performed at the time of installation and/or during maintenance of the facility (e.g., tune-up measurement) is used as a basis, the necessary measurements may be performed once at the time of installation and/or during maintenance of the magnetic resonance apparatus.

This embodiment taking the time dependence into account may be used, for example, within the scope of turbo spin echo (TSE) imaging (e.g., on joints). Due to the spatial constraints and/or restrictions on the patient, joints (e.g., hand, shoulder, knee, foot) may not be positioned in the isocenter of the magnet. The prominent point of the region of interest therefore lies in a region of particularly active higher-order residual eddy current fields that may lead to image artifacts (e.g., ghost images). The artifacts may be reduced using the method according to the present embodiments.

The first-order or zeroth-order local components originating from the development may be compensated for using an image processing function. This would then be a combination of active and passive measures. Thus, for example, the local component of the first-order residual eddy current fields may be compensated for (e.g., "gradient-like") actively by appropriate application of compensation gradient pulses, while the zeroth order of the local components is compensated for passively using appropriate image correction measures. In diffusion-weighted EPI imaging, for example, temporally constant zeroth-order eddy current fields manifest as a displacement of the entire image in the phase-encoding direction, which may be corrected relatively easily by image processing. Since the corresponding control possibilities do exist, it may be more beneficial to carry out an active compensation completely.

In one embodiment, a magnetic resonance apparatus that is configured for performing the method for compensating for eddy current fields in magnetic resonance images acquired using a magnetic resonance apparatus is provided. The magnetic resonance apparatus may include, for example, a control device that determines the correction terms from the residual eddy current fields using the development and initiates a corresponding activation of the at least one device (e.g., a reference oscillator and/or a gradient coil). All explanatory statements made in relation to the method may be applied analogously to the magnetic resonance apparatus, with the result that the same advantages may be achieved with the apparatus.

DETAILED DESCRIPTION OF THE DRAWINGS

In the following description, it is essentially assumed that zeroth- and first-order global components of eddy current fields in a magnetic resonance apparatus are corrected in an already known manner using a change in a phase and/or a frequency of a reference oscillator and by changes to control parameters for a gradient coil, such that only higher-order residual eddy current fields are still present at points lying outside an isocenter of the magnetic resonance apparatus. The higher-order residual eddy current fields are to be actively and locally compensated for using the method according to the present embodiments. A pre-emphasis method and/or an offset method may be used, as already described, for global compensation, both of which change the control parameters of the reference oscillator and the gradient coil in order to achieve a global correction.

Figure 1:
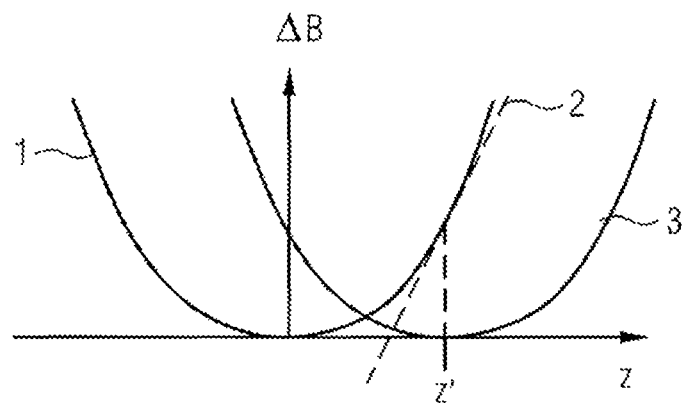
FIG. 1 shows a graph of residual eddy current field as a function of spatial coordinate.

The basic principle of the present embodiments is illustrated in a simplified one-dimensional example with the aid of the graph shown in FIG. 1. On a vertical axis, the graph shows residual eddy current field ΔB as a function of spatial coordinate z. In this case, ΔB is a second-order (e.g., parabolic) residual eddy current field, so a global correction using standard hardware (e.g., gradients and a reference oscillator) is not possible. If a volume of interest extending around a prominent point z' characterizing the volume of interest is considered, there is a strongly inhomogeneous residual eddy current field 1 having a considerable offset that may lead to artifacts. In one embodiment, a localized correction that is focused on the volume of interest at z' is provided. The residual eddy current field 1 is developed around the point z', where a zeroth-order local component and a first-order local component are considered (e.g., compare dashed curve 2). Since zeroth- and first-order components are given, the zeroth- and first-order components may be mapped onto further correction terms (e.g., additional gradient offsets and shifts in frequency and/or phase of the reference oscillator). If these additional compensation measures are taken into account in the control of the gradients or of the reference oscillator, the curve 1 describing the residual eddy current field may be transitioned into the curve 3, with the result that locally strongly reduced eddy current fields are present at the point z'. Consequently, the artifacts may also be substantially reduced.

The method consequently proceeds on the basis that the volume of interest in an examination may be restricted and spatially displaced with respect to the isocenter of the magnetic field (e.g., located at z=0 in FIG. 1). The control of the gradient coil or the reference oscillator is optimized such that the zeroth- and first-order residual eddy current fields are minimized locally. Accordingly, a partial compensation of higher-order residual eddy current fields is effectively produced.

Figure 2:
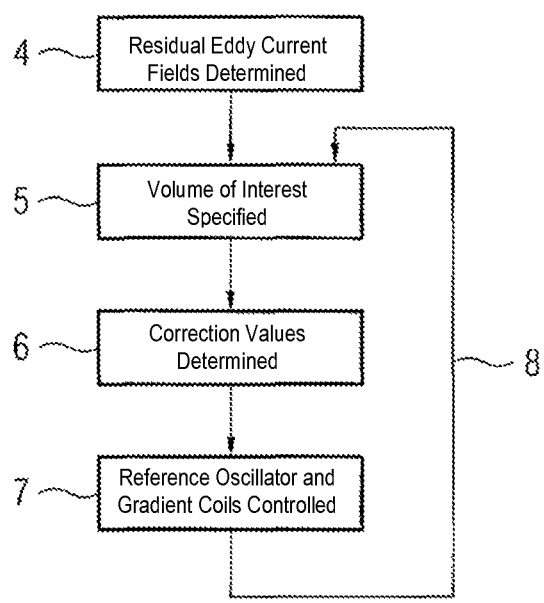
FIG. 2 is a flowchart of one embodiment of a method for compensating for eddy current fields in magnetic resonance images acquired using a magnetic resonance apparatus.

FIG. 2 shows a flowchart of the basic acts of one embodiment of a method for compensating for eddy current fields in magnetic resonance images acquired using a magnetic resonance apparatus. The method is represented in a first exemplary embodiment for diffusion-weighted EPI imaging, though this is only by way of example. The method may also be applied to all other imaging techniques (e.g., to diffusion imaging and magnetic resonance spectroscopy).

In act 4, the residual eddy current fields, including the residual eddy current fields of higher orders, are determined for the current image acquisition protocol. The current image acquisition protocol is, for example, provided to determine, through the acquisition of magnetic resonance images as part of a preliminary measurement, the residual eddy current fields with no diffusion gradient connected and in three further measurements for fixed values for the diffusion gradients in the x-direction, the y-direction, and the z-direction. This takes place on the assumption of time constancy at least in a time range relevant to image distortions (e.g., during the echo planar imaging (EPI) readout sequence). The result obtained for each recorded pixel is a distortion vector V (x, y, z) (e.g., in a unit pixel or a voxel) that is also dependent on a finally actually applied diffusion gradient. The residual eddy current field amplitude may be calculated directly from the distortion vector V (x, y, z):

$$\Delta B(x,y,z) = 2\pi/\gamma * V(x,y,z) * BW.$$

BW is a bandwidth in pixels in a phase-encoding direction, which is the most relevant direction for EPI imaging, since the greatest sensitivity is present in the phase-encoding direction, and γ is a gyromagnetic ratio.

A combination of measurement and calculation is used for determining the residual eddy current fields, since measurements are performed for specific values of the diffusion gradients; from these other values of the diffusion, gradients are determined by deduction.

Other possibilities may be employed for determining the residual eddy current fields for the actual image acquisition protocol. Thus, for example, a field camera may be used for the measurement, or calculations may be performed based on a preliminary measurement conducted during a tune-up of the magnetic resonance apparatus. Provided the type of measurement and/or calculation permits, a time-dependent examination of the eddy current fields, and hence a time-dependent active compensation, which will be explained in more detail in relation to the second exemplary embodiment of the method according to the present embodiments, may be performed.

In act 5, a volume of interest described using a prominent point is specified. The volume of interest may be specified automatically by, for example, evaluation of a localizer image (e.g., by segmentation) or by using data of a system for automatic layer position alignment. Additionally or alternatively, the volume of interest may be specified at least partially by a user who marks the volume of interest, for example, in a localizer. These operations are known and do not need to be explained in more detail. The prominent point is chosen as a focal point of the specified volume of interest.

In one embodiment, the focal point is not chosen as the geometrical center point of the entire volume of interest. Instead, a weighting (e.g., a self-weighting) of individual pixels of the volume of interest takes place. The weighting describes the relevance of the individual pixels of the volume of interest, in the present instance. The self-weighting may be performed, for example, for each pixel on the basis of a signal in a localizer image. Only parts of the volume of interest, in which imaging tissue is present, may be considered relevant. The focal point is not the geometric center point but is influenced by the weighting.

If the volume of interest and the prominent point are known, additional correction values are determined in act 6. The residual eddy current fields around the prominent point are developed (e.g., up to the first order). If the prominent point is designated by (x', y', z'), the following may be written:

$$\Delta B(x,y,z) = \Delta B(x',y',z') + \partial \Delta B(x,y,z)/\partial x|_{(x',y',z')} * (x-x') + \partial \Delta B(x,y,z)/\partial y|_{(x',y',z')} * (y-y') + \partial \Delta B(x,y,z)/\partial z|_{(x',y',z')} * (z-z') + \ldots$$

$\Delta B(x',y',z')$ represents a local component of the zeroth-order residual eddy current fields that may be compensated for using an offset of the frequency of the reference oscillator (e.g., used for the radio-frequency excitation pulses and for the demodulation of the receive signal). Partial derivatives represent the first-order local components of the residual eddy current fields, which may be compensated for using an offset of the imaging gradients. In act 6, as is known from the global compensation, correction values for the frequency and/or phase, the gradient offset, and, where applicable, for a compensation gradient, which are to be used in addition to the global compensation, are determined.

In act 7, the reference oscillator and the gradient coils are controlled accordingly.

If images of a plurality of different volumes of interest are to be acquired, a return may be made in accordance with the arrow 8 to act 5 for the next volume of interest (e.g., in the case of multilayer image acquisition). In one embodiment, all volumes of interest to be imaged may be defined in advance so that the process may be continued immediately for the next volume with act 6.

In one embodiment of the method, rapidly controllable field coils that are configured for compensating second-order eddy current fields are present in the magnetic resonance apparatus. The zeroth-, first- and second-order compensation is performed on a global level. In order to apply the method according to the present embodiments, the residual eddy current fields that remain following the compensation of the zeroth-, first- and second-order global components are considered. The residual eddy current fields are developed up to the second order in order to obtain correction values for a corresponding local and active compensating control of the field coils.

In another embodiment of the method, a time characteristic of the residual eddy current fields is determined in act 4. The residual eddy current fields are characterized temporally and spatially. A measurement using a field camera and/or a measurement performed at the time of installation and/or during maintenance of the magnetic resonance apparatus (e.g., a tune-up) may be taken into account as a preliminary measurement, in which, for example, a defined phantom setup is used. A similar approach to that with pre-emphasis methods known from the prior art is basically adopted. However, only the zeroth and first orders may be considered. The higher-order eddy current fields may be measured at least in part also with respect to temporal dependence.

As well as the pre-emphasis parameters that relate to the zeroth- and first-order global components of the eddy current fields, the result obtained from such a measurement is the residual eddy current field amplitude $\Delta B_i(x,y,z;t)$ for each physical gradient axis i (i.e. X, Y or Z) and for the reference gradient amplitude used. The spatial dependence may, for example, be separated from the temporal dependence:

$$\Delta B_i(x,y,z;t) = \Delta B_i(x,y,z) \Delta B_i(t).$$

The temporal dependence (e.g., pulse response) may be described in a good approximation as the sum of exponential terms having different amplitudes and time constants:

$$\Delta B_i(t) = \sum_j a_j \exp(-t/t_j).$$

Many methods known from the prior art may be used to determine the amplitudes $a_j$ and the time constants $t_j$.

Since the spatial dependence is decoupled from the temporal dependence, the development around the prominent point (x', y', z') may be repeated in act 6. The local, time-variable zeroth- and first-order residual eddy current fields $\Delta B_i(x',y',z')\Delta B_i(t)$ and the partial derivatives accordingly multiplied by $\Delta B_i(t)$ may be obtained.

The local components may be compensated for locally through the global pre-emphasis already used by the system being expanded by the corresponding additional exponential timing elements (e.g., the temporal correction values). It may be assumed that the generation of the eddy current fields may be described as a linear system. A starting point is an independent superimposition of the physical spatial axes and a linear scaling of the eddy current fields with the generating gradient pulses.

Figure 3:
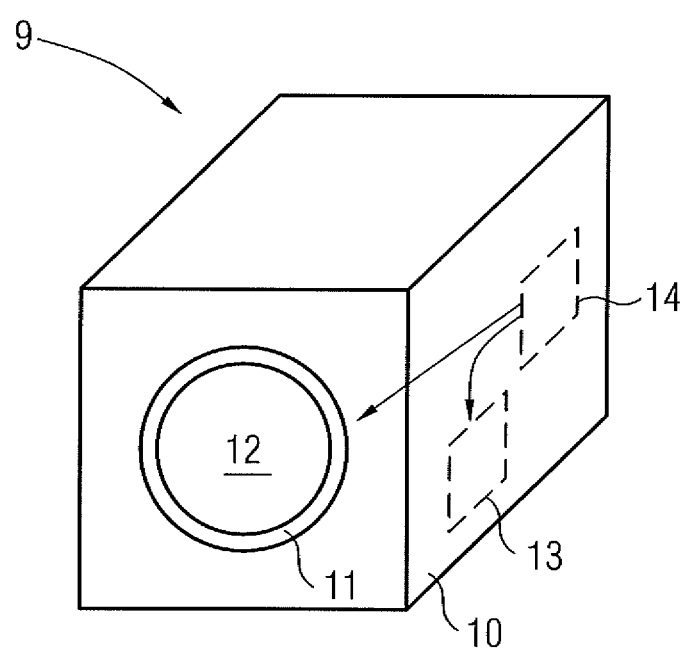
FIG. 3 shows one embodiment of a magnetic resonance apparatus.

FIG. 3 shows a schematic diagram of one embodiment of a magnetic resonance apparatus 9. The magnetic resonance apparatus 9 includes a main magnet unit 10 containing, for example, a cylindrical main magnet. In the interior of the main magnet unit 10, gradient coils 11 are disposed circumferentially around a patient receptacle 12. For clarity of illustration, further known components of a magnetic resonance apparatus (e.g., radio-frequency coils, receive units and like devices are not shown. Only the relevant components for performing the method according to the present embodiments are shown.

In this arrangement, the gradient coils 11 are shielded (e.g., in addition to the primary coils generating the actual gradients, the gradient coils 11 include shielding secondary coils that help in avoiding eddy current fields). A pre-emphasis method is used for further reducing first-order eddy current fields.

The magnetic resonance apparatus 9 also includes a reference oscillator 13 that provides a specific reference frequency for the radio-frequency excitation pulses and the demodulation of the receive signal. A pre-emphasis method is used for further reducing the impact of zeroth-order eddy current fields.

The operation of the magnetic resonance apparatus 9 is controlled by a control device 14 (e.g., a processor) that is configured for performing the method according to the present embodiments. The control device 14 is also configured for controlling the gradient coils 11 and the reference oscillator 13, taking into account the correction values determined from the development of the residual eddy current fields at the prominent point.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for compensating for eddy current fields in magnetic resonance images acquired using a magnetic resonance apparatus, the method comprising:
   compensating for a first component of the eddy current fields corresponding to a zeroth order and a first order using a change in control parameters of at least a part of the magnetic resonance apparatus;
   developing, in order to correct higher-order eddy current fields in a volume of interest characterized by a point, residual eddy current fields remaining following compensation for the first component around the point;
   determining correction values for the control parameters from the zeroth order, the first order, or the zeroth order and the first order second components of the development; and
   controlling the magnetic resonance apparatus as a function of the determined correction values for magnetic resonance image acquisition.

2. The method as claimed in claim 1, wherein the residual eddy current fields are determined on the basis of a measurement, computationally, or on the basis of the measurement and computationally.

3. The method as claimed in claim 2, wherein the residual eddy current fields are determined taking into account a preliminary measurement on an object to be imaged, a measurement using a field camera, a measurement performed during a tune-up of the magnetic resonance apparatus, or a combination thereof.

4. The method as claimed in claim 3, wherein the volume of interest is determined by a user, automatically, or by the user and automatically.

5. The method as claimed in claim 1, wherein the volume of interest is determined by a user, automatically, or by the user and automatically.

6. The method as claimed in claim 5, wherein the volume of interest is determined using a localizer.

7. The method as claimed in claim 1, wherein the point is determined as a focal point of the volume of interest.

8. The method as claimed in claim 7, wherein the point is determined using a weighting function.

9. The method as claimed in claim 8, wherein each pixel of a magnetic resonance image is weighted with a measured intensity for the purpose of the weighting function.

10. The method as claimed in claim 8, wherein the point is determined using a self-weighting.

11. The method as claimed in claim 9, wherein the magnetic resonance image is of a localizer.

12. The method as claimed in claim 9, further comprising re-determining the correction values for a new volume of interest when the volume of interest is changed.

13. The method as claimed in claim 1, further comprising re-determining the correction values for a new volume of interest when the volume of interest is changed.

14. The method as claimed in claim 1, further comprising determining, if field coils are configured for compensating for eddy current field components of higher order than first order, the second components corresponding to an order of the field coils of the residual eddy current fields remaining following compensation using the field coils are determined in the development and used for correcting the control of the field coils for compensating for the second components.

15. The method as claimed in claim 14, wherein the higher order is a second order.

16. The method as claimed in claim 1, wherein the magnetic resonance images are acquired using a diffusion imaging method, a spectroscopy method, or a diffusion imaging and spectroscopy method.

17. The method as claimed in claim 1, wherein a time dependence of the eddy current fields is taken into account.

18. The method as claimed in claim 1, wherein the first-order or the zeroth-order second components originating from the development are compensated for using an image processing function.

19. The method as claimed in claim 1, wherein a pre-emphasis method, an offset method, or the pre-emphasis method and the offset method, in which offsets of a frequency, a phase, or the frequency and the phase of a reference oscillator, a modified control of a gradient coil, or a combination thereof is determined and switched, are used in order to determine the modified control parameters for global compensation purposes.

20. A magnetic resonance apparatus configured to compensate for eddy current fields in magnetic resonance images acquired using a magnetic resonance apparatus, the magnetic resonance apparatus comprising:
   a control device configured to:
      compensate for a first component of the eddy current fields corresponding to a zeroth order and a first order using a change in control parameters of at least a part of the magnetic resonance apparatus;
      develop residual eddy current fields remaining following compensation for the first component around a point in order to correct higher-order eddy current fields in a volume of interest using the point;
      determine correction values for the control parameters from the zeroth order, the first order, or the zeroth order and the first order second components of the development; and
      control the magnetic resonance apparatus as a function of the determined correction values for magnetic resonance image acquisition.

* * * * *